(12) United States Patent
Han

(10) Patent No.: US 8,466,814 B2
(45) Date of Patent: Jun. 18, 2013

(54) TOUCH SENSOR

(75) Inventor: Dong-Kyoon Han, Seongnam-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 1644 days.

(21) Appl. No.: 11/974,965

(22) Filed: Oct. 17, 2007

(65) Prior Publication Data

US 2008/0122661 A1 May 29, 2008

(30) Foreign Application Priority Data

Nov. 27, 2006 (KR) .................. 10-2006-0117901

(51) Int. Cl.
*H03K 17/94* (2006.01)
*H03M 11/00* (2006.01)

(52) U.S. Cl.
USPC .............................................. 341/33

(58) Field of Classification Search
USPC .............................................. 341/33
See application file for complete search history.

(56) References Cited

U.S. PATENT DOCUMENTS 3,806,673 A * 4/1974 Boulanger .............. 200/5 A
4,614,937 A * 9/1986 Poujois ................... 341/33

FOREIGN PATENT DOCUMENTS

| GB | 1551960 | 5/1976 |
|----|---------|--------|
| GB | 2426344 | 11/2006 |
| JP | 2000-89910 | 3/2000 |
| KR | 10-0606081 B1 | 7/2006 |
| WO | WO 03/044957 | 5/2003 |

OTHER PUBLICATIONS

Engelmann, Harry; Patent Application Publication No. US 2003/0210537 A1; Publication Date: Nov. 13, 2003; "Arrangement for Illuminating a Switch Surface for a Touch . . . ;".

* cited by examiner

*Primary Examiner* — Renee S Luebke
*Assistant Examiner* — Lheiren Mae Caroc
(74) *Attorney, Agent, or Firm* — Cha & Reiter, LLC

(57) ABSTRACT

A touch sensor includes a Printed Circuit Board (PCB) that is transparent with respect to light in a visible wavelength band, an upper clad and a lower clad formed on the top face and the bottom face of the PCB, a light source for emitting light to a side of the PCB, and a key top layer disposed on the upper clad.

22 Claims, 12 Drawing Sheets

TOUCH SENSOR

CLAIM OF PRIORITY

This application claims the benefit under 35 U.S.C. §119 (a) of a Korean Patent Application filed in the Korean Intellectual Property Office on Nov. 27, 2006 and assigned Serial No. 2006-117901, the entire disclosure of which is hereby incorporated by reference.

BACKGROUND OF THE INVENTION

1. Field of the Invention

The present invention generally relates to a touch sensor, and in particular, to a capacitive touch sensor.

2. Description of the Related Art

A touch sensor has been widely used as an input device for electronic appliances, portable communication terminals, or industrial installation equipment. The touch sensor allows selection of various input patterns, such as handwriting and simplification of an external structure. A user's sense of pressing in the touch sensor is degraded when compared to a dome-switch type input device.

Moreover, the input devices of a touch sensor type have to include means for allowing users to make accurate selections in poor environments, such as a backlighting means. The backlighting means of the touch sensor improves user's visibility when the touch sensor is used in a dark environment, thereby allowing the user to check if a desired button is pressed. A plurality of light emitting diodes may be surface-mounted on a circuit board in the backlighting means, and light from the light emitting diodes may be emitted directly to the touch sensor.

FIG. 1 illustrates the structure of a conventional touch sensor 100. Referring to FIG. 1, the touch sensor 100 includes a touch panel 110 having an electrode layer 111 and a Printed Circuit Board (PCB) 120 disposed below the touch panel 110. The touch panel 110 includes a substrate 112 capable of transmitting light in a visible wavelength band and the electrode layer 111 disposed on the substrate 112. The substrate 112 may be made of a dielectric material except for a metal material. The electrode layer 111 may have at least one electrode patterns 111a and 111b formed on its top face in order to form electrical contacts by user's touch.

The PCB 120 includes circuits for controlling and driving the touch sensor 100 and at least one light source 121 and 122 for backlighting the touch panel 110. The light sources 121 and 122 may be light emitting diodes and may be surface-mounted on the top face of the PCB 120. The light sources 121 and 122 are surrounded by guide means 131 and 132 for guiding generated light towards the substrate 112.

However, the conventional touch sensor 100 has to include the light sources 121 and 122 for backlighting and the guide means 131 and 132, and the light sources 121 and 122, the electrode patterns 111a and 111b, and the guide means 131 and 132 have to be arranged in the vertical direction. That is, in the conventional touch sensor 100, the electrode patterns 111a and 111b and the light sources 121 and 122 have to be in one-to-one correspondence, thus increasing volume, power consumption, and manufacturing cost.

Moreover, since the space for minimizing the influence of an electromagnetic wave in the touch sensor 100 increases the thickness of the touch sensor 100, the touch sensor 100 is not suitable for use in small-size portable image devices.

SUMMARY OF THE INVENTION

An aspect of the present invention is to address at least the above problems and/or disadvantages and to provide at least the advantages described below. Accordingly, an aspect of the present invention is to provide a touch sensor that can be used for a small-thickness and small-size product.

According to one aspect of the present invention, there is provided a touch sensor including a Printed Circuit Board (PCB) that is transparent with respect to light in a visible wavelength band, an upper clad and a lower clad formed on the top face and the bottom face of the PCB, a light source for emitting light to a side of the PCB, and a key top layer disposed on the upper clad.

BRIEF DESCRIPTION OF THE DRAWINGS

The above and other features and advantages of exemplary embodiments of the present invention will be more apparent from the following detailed description taken in conjunction with the accompanying drawings, in which.

Throughout the drawings, the same drawing reference numerals will be understood to refer to the same elements, features and structures.

DETAILED DESCRIPTION OF THE PRESENT INVENTION

The matters defined in the description such as a detailed construction and elements are provided to assist in a comprehensive understanding of exemplary embodiments of the invention. Accordingly, those of ordinary skill in the art will recognize that various changes and modifications of the embodiments described herein can be made without departing from the scope and spirit of the invention. For the purposes of clarity and simplicity, descriptions of well-known functions and constructions are omitted for clarity and conciseness.

Figure 1:
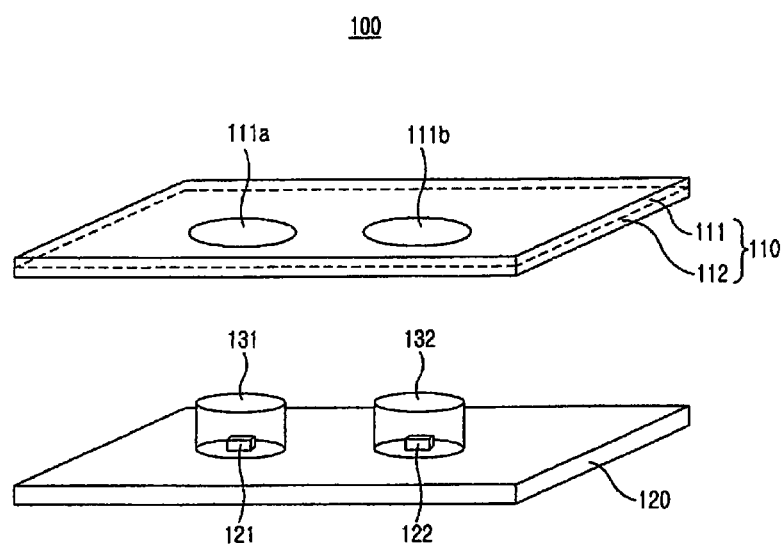
FIG. 1 illustrates the structure of a conventional touch sensor.
Figure 2A:
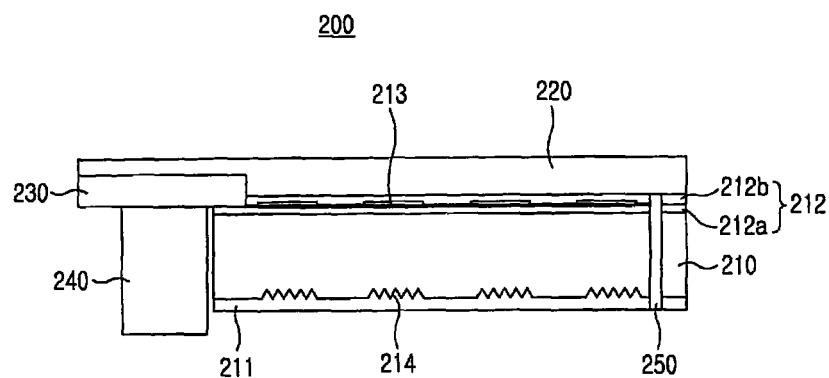
FIGS. 2A and 2B illustrate a touch sensor according to a first exemplary embodiment of the present invention.
Figure 2B:
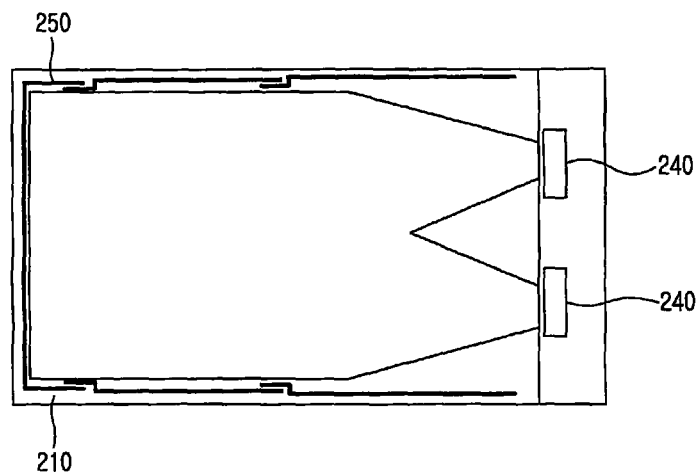

FIGS. 2A and 2B illustrate a touch sensor 200 according to a first exemplary embodiment of the present invention.

As shown, the touch sensor 200 includes a Printed Circuit Board 210 that is transparent with respect to light in a visible wavelength band, upper and lower clads 212 and 211 formed on the top face and the bottom face the PCB 210, a light source 240 for emitting light towards a side of the PCB 210, and a key top layer 220 disposed on the upper clad 212.

The light source 240 is supported on the PCB 210 by a separate support member 230 and may be a light emitting diode capable of emitting light towards a side of the PCB 210.

The PCB 210 includes a light blocking member 250 inserted into the circumferential face of the PCB 210 except for a side facing the light source 240 and a reflective pattern 214 formed at a boundary with the lower clad 211. As mentioned above, the PCB 210 is transparent with respect to light in the visible wavelength band and may be made of a dielectric material, glass, or a polymer material having higher refractive index than those of the upper clad 212 and the lower clad 211. In other words, the PCB 210 serves as a core for light guiding purposes and satisfies a boundary condition with the upper clad 212 and the lower clad 211, thus guiding the light incident from the light source 240.

The reflective pattern 214 may be formed at a portion of the boundary contacting with the lower clad 211 or the upper clad 212 by molding, stamping, or etching process, and serves to reflect a portion of light guided to the PCB 210 towards the key top layer 220.

The upper clad 212 and the lower clad 211 may be adhered to both faces of the PCB 210 by an adhesive material, such as epoxy, or may be coated onto both faces of the PCB 210. The upper clad 212 and the lower clad 211 may be made of a material having a lower refractive index than the PCB 210 in order to satisfy the boundary condition for totally reflecting the light incident to the PCB 210. The upper clad 212 may be formed to bury a conductive pattern layer 213 therein, and may include a clad 212a contacting with the PCB 210 and a protection layer 212b for protecting the conductive pattern layer 213.

The conductive pattern layer 213 may be formed of conductive polymer or a transparent electrode and function as a touch sensor including an electrical interconnection line and a sensor electrode. The electrical interconnection line may be formed by patterning that etches a conductive film, such as copper foil, or patterning that uses silver (Ag) paste.

The light blocking member 250 reflects the light guided to the PCB 210 towards the PCB 10 or blocks the light, thereby suppressing the leakage of light to the outside of the PCB 210. As illustrated in FIG. 2B, the light blocking member 250 may be buried along the circumference of the PCB 210 except for a side facing the light source 240. That is, the light blocking member 250 may be formed by forming a linear cross section along the circumference of the PCB 210 and then performing adsorption, dip-coating, or electroless plating on the cross section with a print material such as ink capable of blocking light. The light blocking member 250 may also be in a partially cut structure as illustrated in FIG. 2B.

Figure 3:
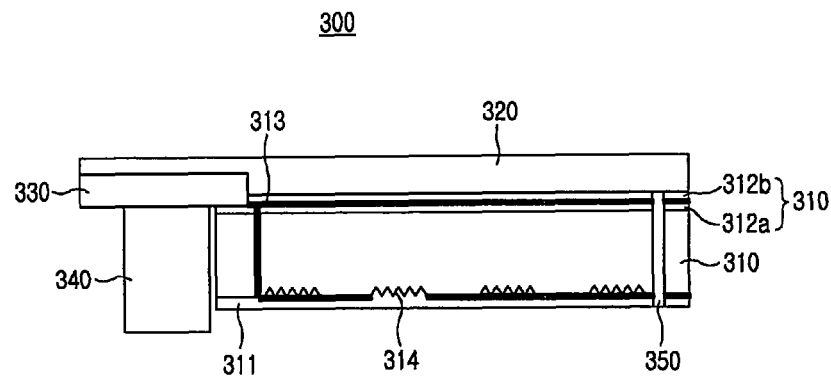
FIG. 3 illustrates a touch sensor according to a second exemplary embodiment of the present invention.

FIG. 3 illustrates a touch sensor 300 according to a second exemplary embodiment of the present invention.

As shown, the touch sensor 300 includes a PCB 310 that is transparent with respect to light in the visible wavelength band, upper and lower clads 312 and 311 formed on the top face and the bottom face of the PCB 310, a light source 340 for emitting light to a side of the PCB 310, a key top layer 320 disposed on the upper clad 312, a light blocking member 350, and a support member 330.

In the touch sensor 300, the upper clad 312 and a conductive pattern layer 313 formed on the top face of the PCB 310 are connected with each other by a via-hole that passes through the PCB 310. Such a structure can be applied when the conductive pattern layer 313 in the form of a linear lattice electrode is formed on the top face and the bottom face of the PCB 310. The upper clad 312 may include a clad 312a between the conductive pattern layer 313 and the PCB 310, and a protection layer 312b on the conductive pattern layer 313.

The other structure of the touch sensor 300 according to the second exemplary embodiment of the present invention is similar to that of the touch sensor 200 according to the first exemplary embodiment of the present invention, and thus will not be described in detail to avoid redundancy.

Figure 4A:
FIGS. 4A through 4I are cross-sectional views showing the steps of manufacturing a touch sensor according to the present invention.
Figure 4B:
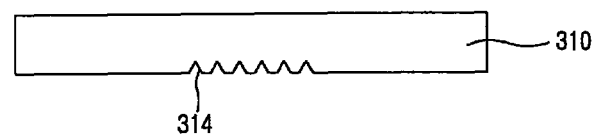
Figure 4C:
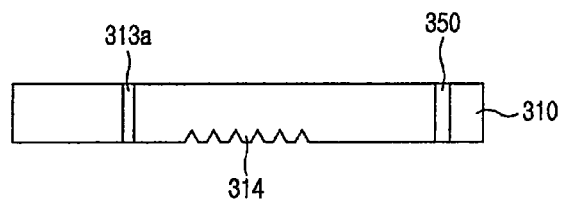
Figure 4D:
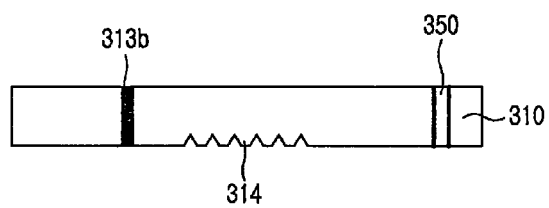
Figure 4E:
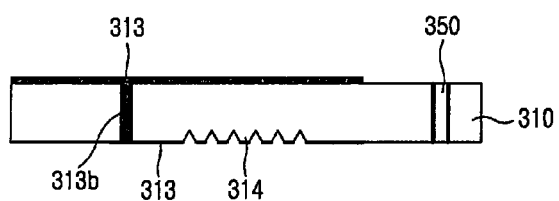
Figure 4F:
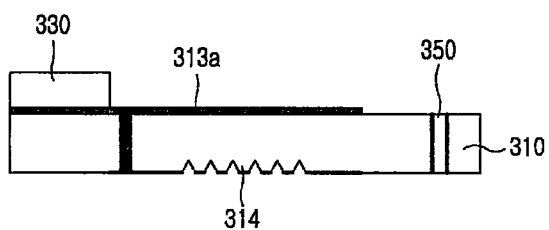
Figure 4G:
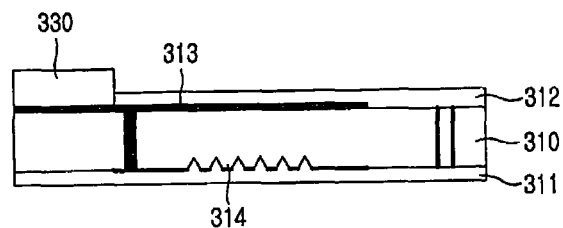
Figure 4H:
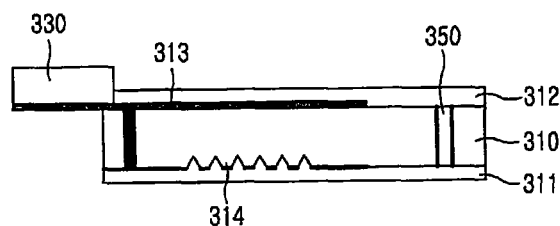
Figure 4I:
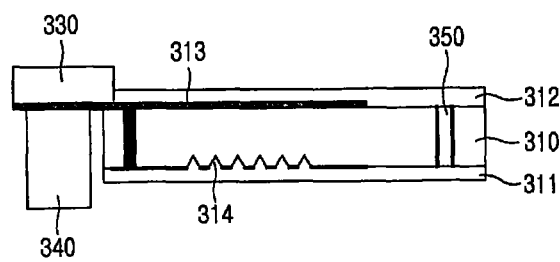
Figure 5:
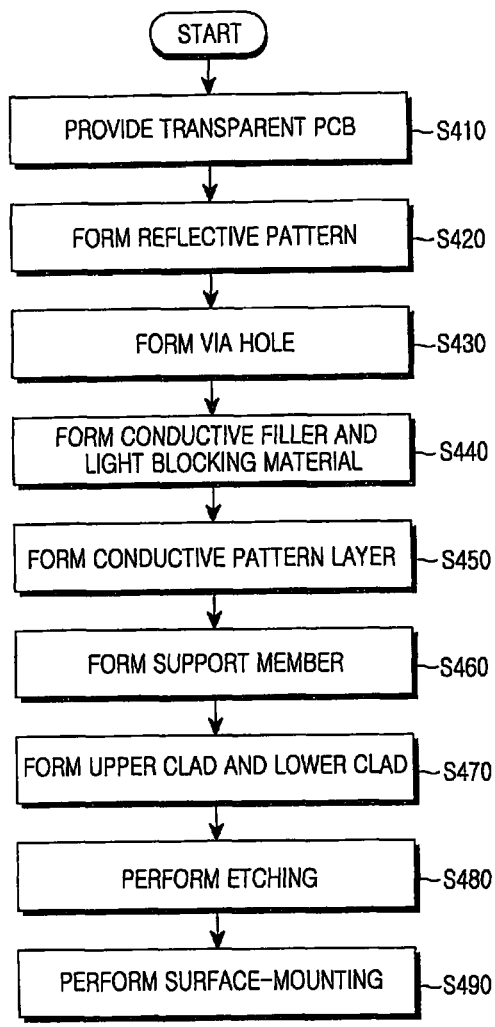
FIG. 5 is a flowchart of a process of manufacturing a touch sensor illustrated in FIGS. 4A through 4I.

FIGS. 4A through 4I are cross-sectional views showing the operation steps of manufacturing a touch sensor according to the present invention, and FIG. 5 is a flowchart of the manufacturing steps illustrated in FIGS. 4A through 4I. Unlike in FIGS. 2A and 3, a conductive pattern layer is formed on a PCB in FIGS. 4A through 4I and 5.

Referring to FIG. 5, an optically transparent PCB is provided in step S410. A reflective pattern is formed on the PCB in step S420. A via-hole passing through the PCB is formed in step S430. A conductive filler and a light blocking material are formed in the via-hole in step S440. A conductive pattern layer is formed in step S450. A support member is formed in step S460. A lower clad and an upper clad are formed in step S470. Etching is performed in step S480. Surface-mounting is performed in step S490.

FIGS. 4A and 4B show cross sections in which an optically transparent PCB 310 capable of transmitting light is formed and a reflective pattern 314 is formed on a face of the PCB 310. The reflective pattern 314 performs a diffuse reflection on light contacting with the reflective pattern 314 out of the light traveling on the PCB 310. The reflective pattern 314 may be formed as one piece with the PCB 310 during the formation of the PCB 310 or may be formed by scratch, stamping, printing, etching, or the like after the formation of the PCB 310.

FIGS. 4C and 4D show cross sections in which a hole 313a passing through the PCB 310 is formed in order to form a via-hole 313b and a light blocking member 350. The via-hole 313b may be formed by filling a conductive filler into the hole 313a illustrated in FIG. 4C. As illustrated in FIG. 2B, the light blocking member 350 is formed as being partially cut instead of as one piece, thereby preventing the PCB 310 from being cut.

FIGS. 4E and 4F show cross sections in which conductive pattern layers 313 are formed on the top face and bottom faces of the PCB 310, and the light blocking member 350 is formed by performing adsorption, dip-coating, or electroless plating on the hole 313a with a print material such as ink capable of blocking light.

The conductive pattern layers 313 on the top face and the bottom face the PCB 310 may be electrically connected to each other by the via-hole 313b.

FIG. 4G illustrates a cross section in which a support member 330 is formed on the PCB 310 having the light blocking member 350 and the conductive pattern layers 313 formed therein, and an upper clad 311 and a lower clad 312 having lower refractive indices than that of the PCB 310 are formed. The lower clad 311 and the upper clad 312 protect the PCB 310 and satisfy a total reflection condition at the boundary with the PCB 310, thereby guiding the light incident to one side of the PCB 310 to the other side of the PCB 310.

FIG. 4H illustrates a cross section in which a portion of the PCB 310 having the support member 330 formed therein is removed, and FIG. 4I illustrates a cross section in which a light source 340 is coupled under the support member 330.

Figure 6A:
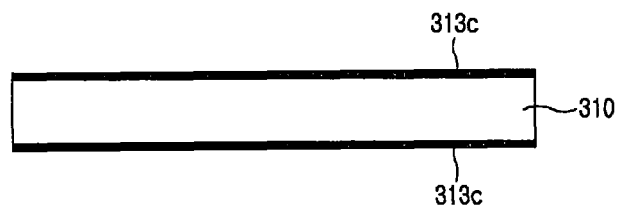
FIGS. 6A through 6J are cross-sectional views showing the steps of manufacturing a touch sensor according to the present invention.
Figure 6B:
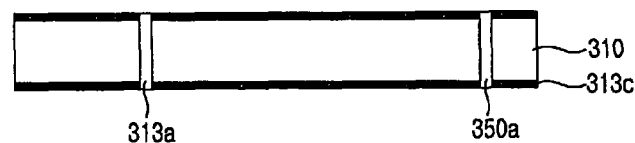
Figure 6C:
Figure 6D:
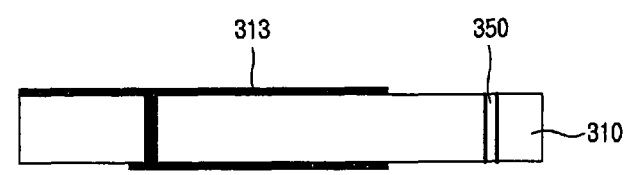
Figure 6E:
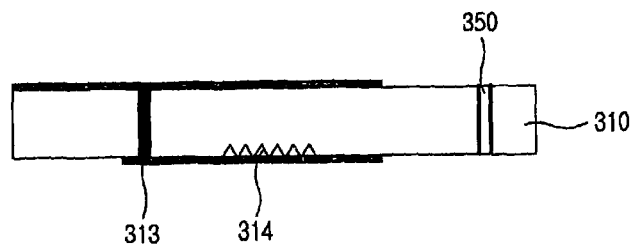
Figure 6F:
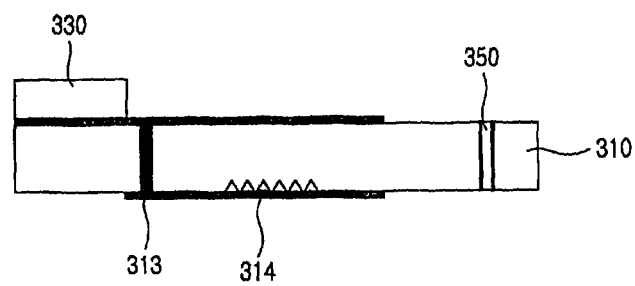
Figure 6G:
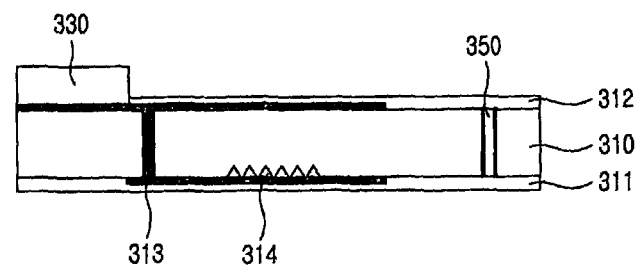
Figure 6H:
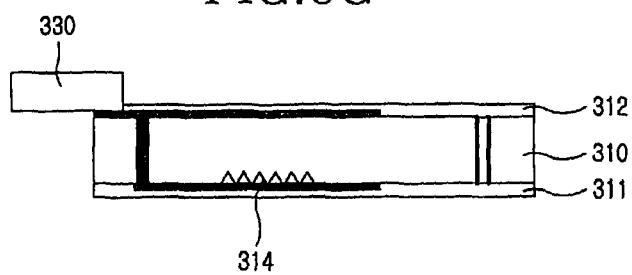
Figure 6I:
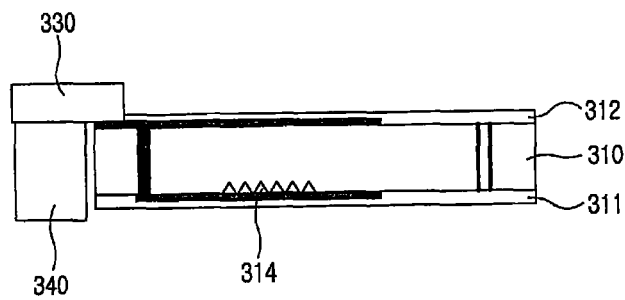
Figure 6J:
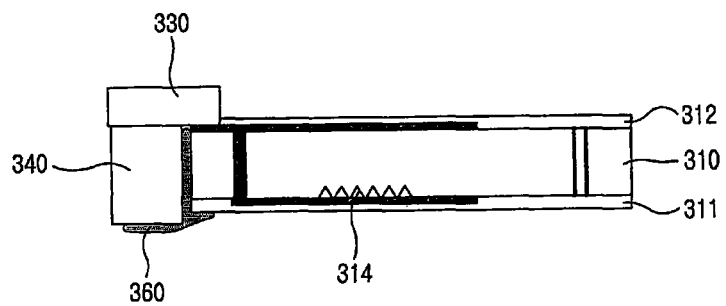
Figure 7:
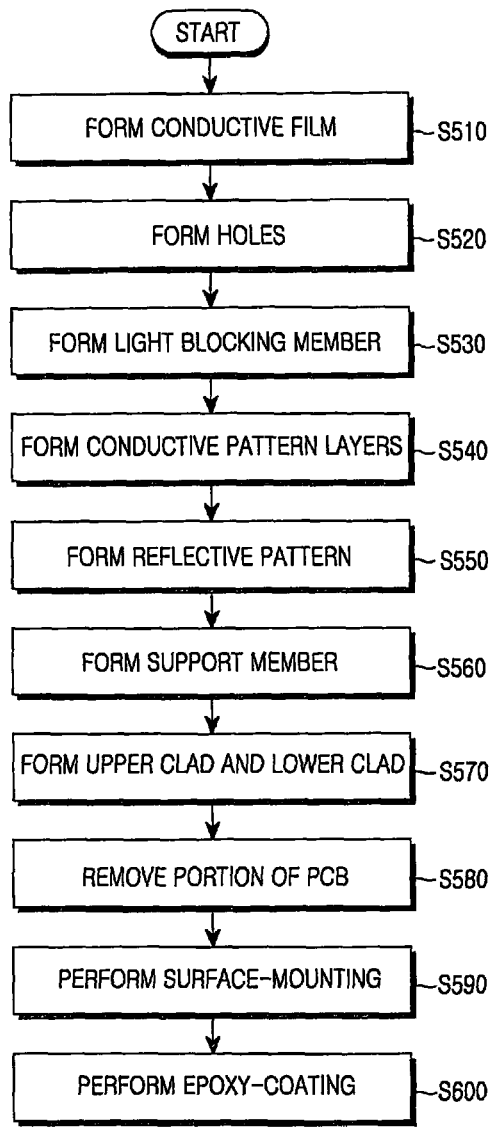
FIG. 7 is a flowchart of a process of manufacturing a touch sensor illustrated in FIGS. 6A through 6J.

FIGS. 6A through 6J are cross-sectional views showing the operation steps of manufacturing a touch sensor according to the present invention, and FIG. 7 is a flowchart of a process of manufacturing the touch sensor illustrated in FIGS. 6A through 6J.

Referring to FIG. 7, a conductive film for forming conductive pattern layers on the top face and the bottom face of an optically transparent PCB is formed in step S510. Holes passing through the PCB are formed in step S520. A light blocking member is formed in step S530. The conductive pattern layers are formed in step S540. A reflective pattern is formed in step S550. A support member is formed in step S560. An upper clad and a lower clad are formed in step S570. A portion of the PCB under the support member is removed in step S580. Surface-mounting on the PCB is performed in step S590. Epoxy-coating is performed in step S600.

FIG. 6A illustrates a cross section in which a conductive film 313c for forming conductive pattern layers is attached. FIG. 6B illustrates a cross section of a PCB 310 in which holes 313a and 350a passing through the PCB 310 are formed. FIG. 6C illustrates a cross section in which a conductive filler is filled into a portion of the hole 313a in order to form a via-hole 313b. The via-hole 313b electrically connects the conductive films 313c on the top face and the bottom face of the PCB 310.

FIG. 6D illustrates a cross section in which a light blocking layer 350 is formed in portions of the holes 313a and 350a, and the conductive pattern layers 313 are formed on the top face and the bottom face of the PCB 310 by patterning the conductive film 313c. FIG. 6E illustrates a cross section in which a reflective pattern 314 is formed on the bottom face of the PCB 310. The reflective pattern 314 may be formed on a portion of the bottom face of the PCB 310 in which the conductive pattern layer 313 is not formed. FIG. 6F illustrates a cross section in which a support member 330 is placed at tan end of a side of the PCB 310.

FIG. 6G illustrates a cross section in which an upper clad 311 and a lower clad 312 having lower refractive indices than that of the PCB 310 are formed on the top face and the bottom face of the PCB 310. FIG. 6H illustrates a cross section in which a portion of the PCB 310 under the support member 330 is removed by etching or cutting. FIG. 6I illustrates a cross section in which a light source 340 is coupled under the support member 330. The light source 340 is disposed in such a way that its emitting surface faces a side of the PCB 310. FIG. 6J illustrates a cross section in which epoxy 360 is coated between the light source 340 and the PCB 310. The epoxy 360 may be determined based on refractive index matching between the light source 340 and the PCB 310.

Figure 8A:
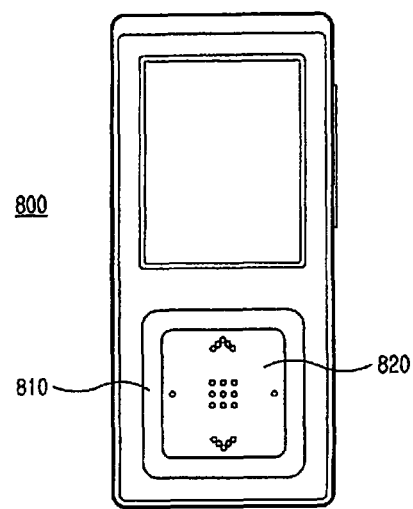
FIGS. 8A and 8B are views for comparing a keypad assembly according to the present invention and a conventional keypad assembly.
Figure 8B:
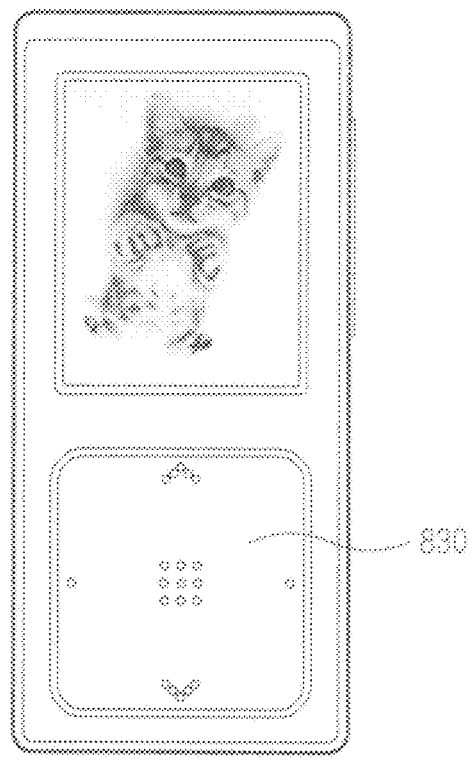

FIGS. 8A and 8B are views for comparing a keypad assembly 830 using a touch sensor according to the present invention with a conventional keypad assembly 800. FIG. 8A illustrates a conventional portable electronic device having the keypad assembly 800 in which a touch sensor 820 and a dome-type switch member 810 are separately arranged. FIG. 8B illustrates a portable electronic device having the keypad assembly 830 according to the present invention, in which a touch sensor and a dome-type switch member are arranged vertically and downwardly for selection of electrical contacts.

In the keypad assembly 830 illustrated in FIG. 8B, a switch divided into two portions is integrated vertically, thereby reducing the area of the switch and incorporating a backlighting function without a change in thickness.

According to the present invention, since a PCB is made of a transparent material, a backlighting means and the PCB can be integrated as one piece. In other words, the present invention can be applied to a product having small thickness and can simplify the manufacturing process by removing a need for separate processes of manufacturing the PCB and a light guiding plate.

While the invention has been shown and described with reference to exemplary embodiments thereof, it will be understood by those skilled in the art that various changes in form and details may be made therein without departing from the spirit and scope of the invention.

What is claimed is:

1. A touch sensor comprising:
    a Printed Circuit Board (PCB) that is transparent with respect to light in a visible wavelength band;
    an upper clad and a lower clad formed on a top face and a bottom face of the PCB, respectively;
    a light source for emitting light to a side of the PCB;
    a key top layer disposed on the upper clad; and
    a reflective pattern formed in a portion of the PCB, which contacts with the lower clad.

2. The touch sensor of claim 1, further comprising a support member for supporting the light source.

3. The touch sensor of claim 1, further comprising a light blocking member disposed at one end of the PCB away from the light source.

4. The touch sensor of claim 3, wherein the light blocking member comprises a reflection mirror for reflecting a portion of light guided to the PCB towards the PCB.

5. The touch sensor of claim 3, wherein the light blocking member suppresses the leakage of light outside of the PCB.

6. The touch sensor of claim 3, wherein the light blocking member is formed by forming a linear cross section along a circumference of the PCB, and performing adsorption, dip-coating, or electroless plating on the cross section with a print material capable of blocking the light.

7. The touch sensor of claim 1, further comprising an adhesive material for adhering the lower clad and the upper clad to the PCB.

8. The touch sensor of claim 1, further comprising conductive pattern layers formed on the top face and the bottom face of the PCB and electrically connected to each other by a via-hole that passes through the PCB.

9. The touch sensor of claim 1, wherein the PCB is made of a polymer or glass material.

10. The touch sensor of claim 1, wherein the upper clad and the lower clad have lower refractive indices than that of the PCB.

11. The touch sensor of claim 1, wherein the reflective pattern is formed by one of molding, stamping, and etching processes.

12. The touch sensor of claim 1, wherein the PCB serves to guide the light incident from the light source.

13. The touch sensor of claim 1, further comprising a conductive pattern buried in the upper clad.

14. A touch sensor comprising:
    a Printed Circuit Board (PCB) that is transparent with respect to light in a visible wavelength band;
    an upper clad and a lower clad formed on a top face and a bottom face of the PCB, respectively;
    a light source for emitting light to a side of the PCB;
    a key top layer disposed on the upper clad; and
    wherein the upper clad and the lower clad have lower refractive indices than that of the PCB.

15. The touch sensor of claim 14, further comprising a support member for supporting the light source.

16. The touch sensor of claim 14, further comprising a reflective pattern formed in a portion of the PCB, which contacts with the lower clad.

17. The touch sensor of claim 14, further comprising a light blocking member disposed at one end of the PCB away from the light source.

18. The touch sensor of claim 17, further comprising an adhesive material for adhering the lower clad and the upper clad to the PCB.

19. The touch sensor of claim 18, wherein the light blocking member comprises a reflection mirror for reflecting a portion of light guided to the PCB towards the PCB.

20. The touch sensor of claim 14, further comprising conductive pattern layers formed on the top face and the bottom face of the PCB and electrically connected to each other by a via-hole that passes through the PCB.

21. The touch sensor of claim 14, wherein the PCB is made of a polymer or glass material.

22. The touch sensor of claim 14, further comprising a conductive pattern buried in the upper clad.

\* \* \* \* \*